United States Patent
Yieh et al.

(10) Patent No.: US 9,748,148 B2
(45) Date of Patent: Aug. 29, 2017

(54) LOCALIZED STRESS MODULATION FOR OVERLAY AND EPE

(71) Applicant: Applied Materials, Inc., Santa Clara, CA (US)

(72) Inventors: Ellie Y. Yieh, San Jose, CA (US); Huixiong Dai, San Jose, CA (US); Srinivas D. Nemani, Sunnyvale, CA (US); Ludovic Godet, Sunnyvale, CA (US); Christopher Dennis Bencher, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/736,020

(22) Filed: Jun. 10, 2015

(65) Prior Publication Data

US 2016/0005662 A1    Jan. 7, 2016

Related U.S. Application Data

(60) Provisional application No. 62/020,244, filed on Jul. 2, 2014.

(51) Int. Cl.
 *H01L 21/66* (2006.01)
(52) U.S. Cl.
 CPC .............. *H01L 22/12* (2013.01); *H01L 22/20* (2013.01)
(58) Field of Classification Search
 None
 See application file for complete search history.

(56) References Cited

U.S. PATENT DOCUMENTS

| 6,596,604 | B1 | 7/2003 | Lojek et al. | |
|---|---|---|---|---|
| 7,433,051 | B2 | 10/2008 | Owen | |
| 9,484,274 | B2* | 11/2016 | Bencher | |
| 2002/0071994 | A1* | 6/2002 | Shimazu | B82Y 10/00 430/5 |
| 2002/0093648 | A1* | 7/2002 | Nikoonahad | G01N 21/211 356/237.1 |

(Continued)

OTHER PUBLICATIONS

International Search Report and Written Opinion for International Application No. PCT/US2015/033810 dated Aug. 31, 2015.

*Primary Examiner* — Reema Patel
*Assistant Examiner* — Steven Christopher
(74) *Attorney, Agent, or Firm* — Patterson + Sheridan LLP

(57) ABSTRACT

Embodiments of the disclosure provide apparatus and methods for localized stress modulation for overlay and edge placement error (EPE) using electron or ion implantation. In one embodiment, a process for correcting overlay error on a substrate generally includes performing a measurement process in a metrology tool on a substrate to obtain a substrate distortion or an overlay error map, determining doping parameters to correct overlay error or substrate distortion based on the overlay error map, and providing a doping recipe to a doping apparatus based on the doping parameters determined to correct substrate distortion or overlay error. Embodiments may also provide performing a doping treatment process on the substrate using the determined doping repair recipe, for example, by comparing the overlay error map or substrate distortion with a database library stored in a computing system.

15 Claims, 5 Drawing Sheets

(56) References Cited

U.S. PATENT DOCUMENTS

| | | | |
|---|---|---|---|
| 2003/0139838 A1* | 7/2003 | Marella | H01L 22/20 700/110 |
| 2003/0209745 A1 | 11/2003 | Laibowitz et al. | |
| 2005/0042779 A1* | 2/2005 | Han | H01L 22/34 438/14 |
| 2007/0287239 A1 | 12/2007 | Yoon et al. | |
| 2010/0092881 A1 | 4/2010 | Mos et al. | |
| 2011/0164228 A1* | 7/2011 | Van De Kerkhof | G01N 21/211 355/18 |
| 2011/0202298 A1* | 8/2011 | Izikson | H01L 22/20 702/83 |
| 2011/0223737 A1 | 9/2011 | Liu et al. | |
| 2012/0009511 A1* | 1/2012 | Dmitriev | G03F 1/72 430/5 |
| 2012/0146159 A1 | 6/2012 | Wang et al. | |

* cited by examiner

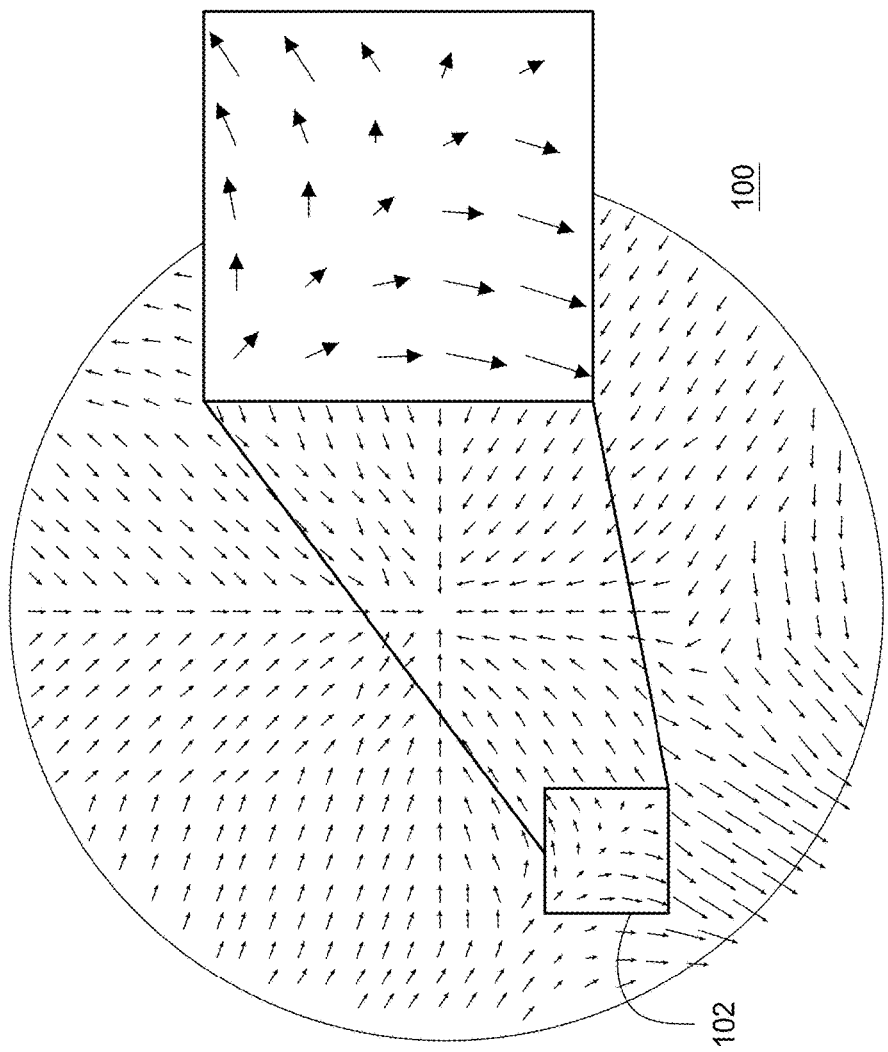
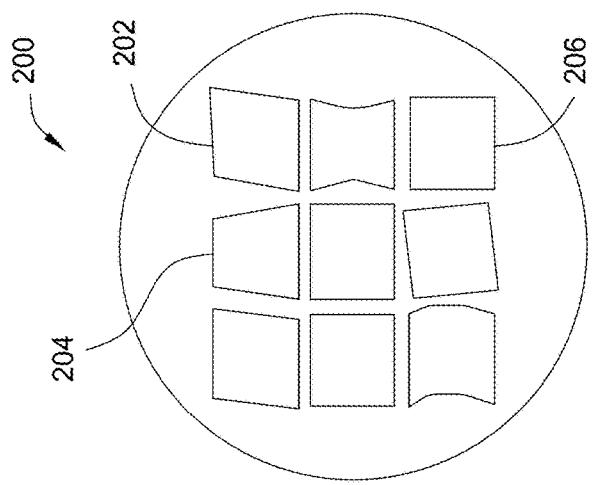
FIG. 1 (PRIOR ART)
FIG. 2 (PRIOR ART)

US 9,748,148 B2

LOCALIZED STRESS MODULATION FOR OVERLAY AND EPE

CROSS-REFERENCE TO RELATED APPLICATIONS

This application claims benefit of U.S. Provisional Patent Application No. 62/020,244, filed Jul. 2, 2014, the entirety of which is herein incorporated by reference.

BACKGROUND

Field

Embodiments of the disclosure provided herein generally relate to apparatus and methods for localized stress modulation, for example, to correct overlay error and edge placement error (EPE).

Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. The layers are built up using a sequence of processes and translate into transistors and electrical circuits that comprise a completed device. Typically, devices on semiconductor substrates are manufactured by a sequence of lithographic processing steps in which the devices are formed from a plurality of overlying layers, each having an individual pattern. Generally, a set of 15 to 100 masks is used to construct a chip and can be used repeatedly.

Between one layer and the next layer that overlays the previous one, the individual patterns of the one layer and the next layer must be aligned. A measurement of alignment marks may be obtained by a metrology tool which is then used by a lithography tool to align the subsequent layers during exposure and again after a lithography process to recheck a performance of the alignment. However, overlay errors (or pattern registration errors or edge placement errors (EPE)) between layers are inevitable, and error budgets are calculated by IC designers for which the manufacturing must meet. Overlay errors of the device structure may originate from different error sources, such as overlay errors from previous exposure tool/metrology tool, current exposure tool/metrology tool, a matching error between the overlay errors of the previous exposure tool/metrology tool and of the current exposure tool/metrology tool, or substrate film layer deformation caused by film stress and the like.

FIG. 1 (Prior Art) depicts an overlay error map 100 of a semiconductor substrate measured after a sequence of lithographic exposure processes. In the embodiment of FIG. 1, some patterns shown in an enlarged portion 102 of the substrate are shifted or displaced from their designed location. As discussed above, displacement or misalignment of the patterns creates overlay errors that may be detriment to device performance.

FIG. 2 (Prior Art) depicts another schematic view of device dies 202, 204, 206 formed on a substrate 200. The dies 202, 2041, 206 are typically designed to have a substantially square-like outline if substantially no overlay errors or pattern displacement has occurred during fabrication. However, when overlay errors or pattern displacement undesirably occurs, the size, dimension or structures of dies 202, 204, 206 formed on the substrate 200 may be irregularly deformed or distorted, thus increasing likelihood of misalignment between the film layers stacked thereon. As a result, the probability of misalignment in the subsequent lithographic exposure process may be undesirably increased.

With the desire for increasingly reduced critical dimensions (CD), it is desired that overlay error in the critical layers of the device structure be minimal or eliminated in order to reliably produce devices with minimal feature sizes, such as a width of a control gate in a device. To reduce the likelihood of overlay errors, a single exposure lithographic tool is used in many cases to pattern successive layers in an attempt to eliminate tool to tool imprecision errors. However, this approach often creates logistic problems and adversely decreases throughput. Furthermore, overlay specifications have become more challenging due to non-lithographic contributions (i.e., film stress). For example, overlay errors through stress induced substrate distortion may alone exceed the error budget.

Therefore, there exists a need for improved methods for correcting overlay errors and EPE.

SUMMARY

In one embodiment, a method for correcting overlay error on a substrate is provided. The method generally includes performing a measurement process in a metrology tool on a substrate to obtain a substrate distortion map or an overlay error map, determining doping parameters to correct overlay error or substrate distortion based on the substrate distortion map or the overlay error map, and providing a doping recipe to a doping apparatus based on the doping parameters determined to correct substrate distortion or overlay error.

In one embodiment, a method for correcting overlay error on a substrate is provided. The method generally includes performing at least one lithographic deposition or etching process on a film layer of the substrate, determining a substrate distortion map, overlay error map, or edge placement error (EPE) introduced by the at least one lithographic deposition or etching process using a stress vector mapping tool, and implanting at least one of electrons or ions into selected discrete locations of the film layer to correct the distortion, overlay error, or EPE.

In one embodiment, a method for correcting overlay error on a substrate is provided. The method generally includes measuring a film stress, substrate curvature or in-plane distortion or pattern shift of a film layer disposed on a substrate, determining an overlay error map or substrate distortion map based on the measured film stress on the film layer, determining a doping repair recipe based on the measured film stress on the substrate, and doping the film layer using the determined doping repair recipe to locally change the film stress of the film layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1 (Prior Art) depicts an overlay error map of a semiconductor substrate measured after a sequence of lithographic processes, in accordance with certain aspects of the present disclosure.

FIG. 2 (Prior Art) is a schematic cross-sectional view of a device structure that is being processed using a particle beam modification process, in accordance with certain aspects of the present disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the disclosure provided herein include apparatus and methods for localized stress modulation, for example, to correct overlay errors and/or edge placement error (EPE). The localized stress modulation process may generally include implantation of ions or electrons while the substrate is disposed within a particle beam generation apparatus.

Figure 3:
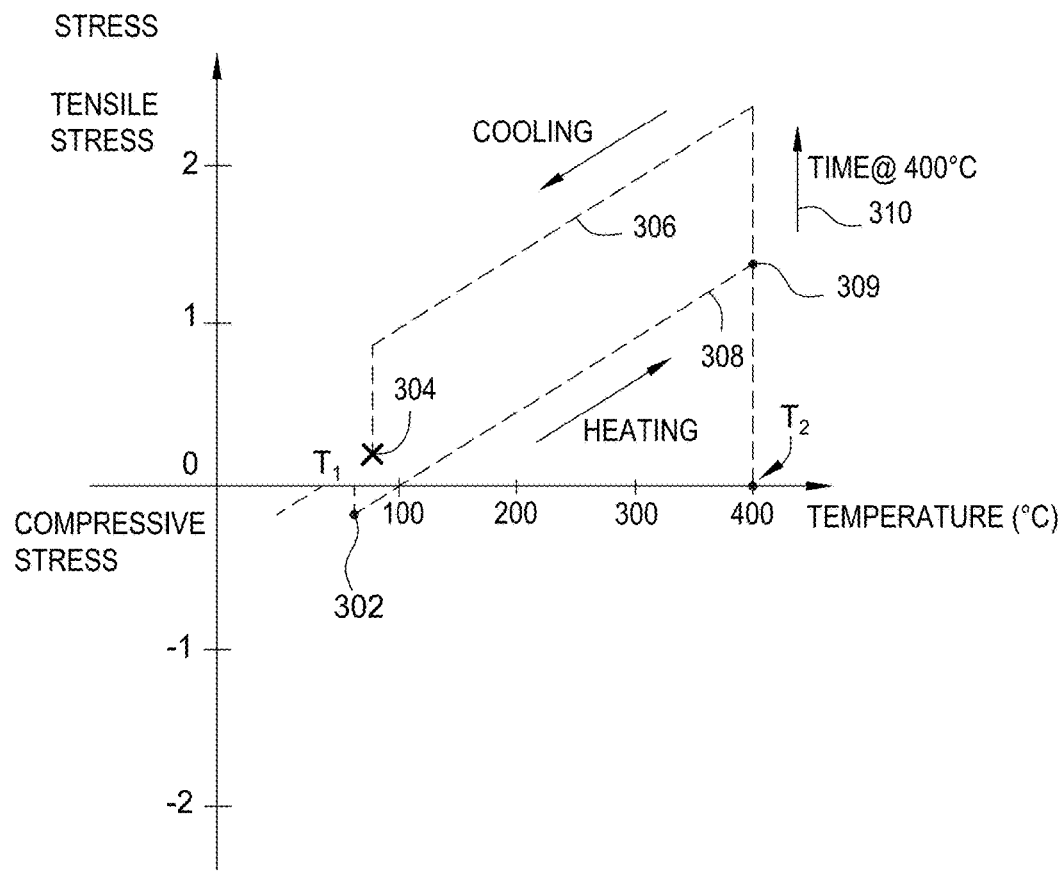
FIG. 3 depicts a stress hysteresis diagram of a film layer, in accordance with certain aspects of the present disclosure.

FIG. 3 depicts a diagram of stress hysteresis of a film layer in response to exposure to thermal process, in accordance with certain aspects of the present disclosure. In the embodiment depicted in FIG. 3, the film layer exposed to the thermal process is a device hardmask layer, such as an amorphous carbon film. It is noted that other types of the film layers, including organic materials, inorganic materials, metal materials, metal dielectric materials, or any other materials that may be utilized to form semiconductor devices may also be tested to record their stress hysteresis to establish database library. Alternatively, a thin capping layer may be disposed on the hardmask layer. The thin capping layer may be a dielectric layer.

In the stress hysteresis diagram depicted in FIG. 3, the film layer may have a first stress value 302 (e.g., an original stress value). It is believed that most device materials undergo residual stress changes when thermally cycled, which inevitably occurs during the subsequent processing steps at high temperatures. During processing, the film layer may undergo thermal energy treatment from a first temperature $T_1$ to a second temperature $T_2$ (e.g., a desired target processing temperature), as indicated by the dotted line 308. While the thermal energy is absorbed by the film layer, the film stress undergoes stress relaxation governed by the film material properties. Stress may also change due to thermal expansion mismatch relative to the substrate, as shown in the dotted line 308, from the first stress value 302 (e.g., the original stress value) with a tensile film property to a second stress value 309. Upon reaching the desired temperature $T_2$ during processing, the film stress may be maintained at a steady value, e.g., the second stress value 309, until the desired processing time or result is reached and completed (i.e. time at temperature $T_2$ illustrated by line 310).

After the thermal energy treatment, the film layer is cooled, for example by resting the substrate on or near a cooling plate, or by placing the substrate in a room temperature environment. The film layer disposed on the substrate may be cooled to a room temperature or to the original starting temperature $T_1$, as indicated by the dotted line 306. As the film layer is cooled, the film stress reduces to a third stress value 304, which is different than the original starting stress value 302.

It is noted that after a sequence of the thermal processing cycles during the multiple semiconductor device manufacturing processes, the film stress of the film layer changes as compared to the film stress of the original film layer. As the film layer may be densified, purified, or deformed after the thermal processing cycles, the film residual stress may undesirably result in substrate bow, warpage or substrate curvature. In such cases, misalignment between the features present on the film layer pattern formed by the lithographic exposure process may become significant, resulting in an overlay error that may result in feature deformation or structure collapse. Additionally, most deposited materials have a native residual stress which induces substrate bow, warpage and grid-distortion simply as a function of their deposition. These stresses are often not uniform across the substrate surface and lead to non-uniform substrate bow, warpage and grid-distortion. Even in a theoretical case where a film deposition has perfectly uniform stress across the substrate, an irregular pattern will be etched into it, which eventually results in a non-uniform substrate bow, warpage, and grid-distortion.

According to certain aspects, non-uniformity in stress across a substrate may be introduced by various lithographic and etching processes. For example chemical vapor deposition (CVD) or physical vapor deposition (PVD) processes. Additionally, stress may be uniform among different substrates. Each substrate may have a different signature. The non-uniformity (distortion) and errors to overlay and EPE may be compounded in multiple film levels.

It is believed that by utilizing an implantation repair process, the residual film stress hysteresis behavior at certain localized areas in the film layer may be exploited to correct substrate warpage and repair the grid-distortion. This will enable improved overlay during the subsequent lithography exposure process. The implanation may assist repairing and releasing local strains or non-uniform stress distribution at certain discrete areas of the film layer so that a more uniform film structure with a substantially uniform film quality may be obtained that improves lithographic alignment with minimum overlay error in a lithographic exposure process.

By obtaining the relationship/correlation of the film stress (or in-plane strain, pattern shift, or substrate curvature) to the implant dose, strength, or chemical composition required to repair the film layer, a database library may be established. As such, the residual film stress at discrete localized areas of the film layer may be corrected or released based on the computation/calculation from the database library, so as to reduce/correct overlay errors that might be present on the substrate and enhance alignment precision of a subsequent lithographic exposure process.

Example Localized Stress Modulation for Overlay and EPE

Figure 4:
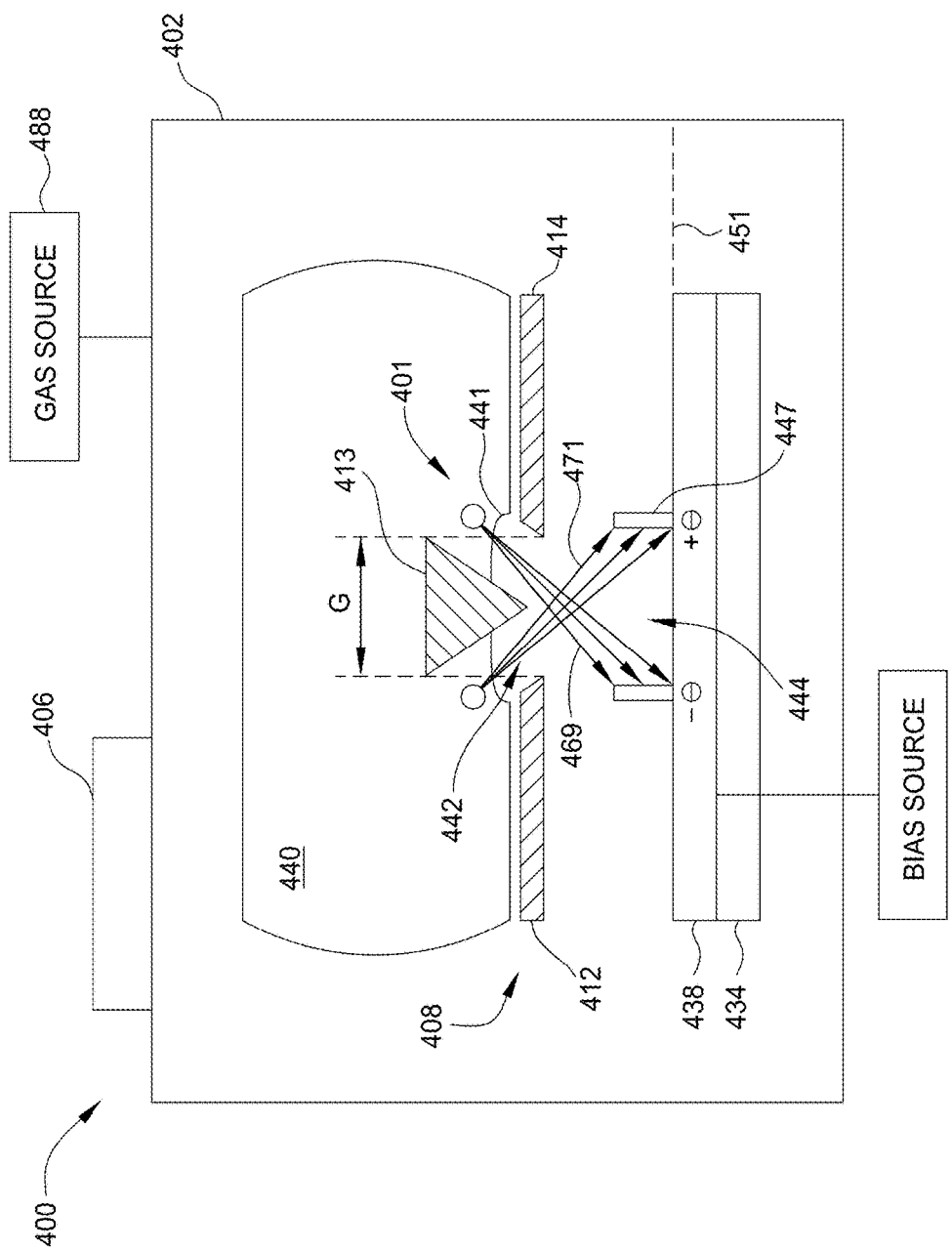
FIG. 4 depicts a plasma processing apparatus that may be utilized to repair overlay errors on a semiconductor substrate, in accordance with certain aspects of the present disclosure.

FIG. 4 is a schematic diagram of a plasma processing apparatus 400 that may be utilized to implant electrons or ions into a film layer that may alter a stress/strain of the film layer so as to correct or repair overlay errors and/or EPE present on semiconductor devices, in accordance with certain aspects of the present disclosure. In addition to the apparatus 400 described below, more traditional ion implantation apparatuses, such as beamline ion implantation apparatus, may be used to perform the methods described herein. Alternatively, ribbon beams and electron beams may be used to perform the embodiments described herein. One example of a beamline ion implantation apparatus is the Varian VIISta® Trident, available from Applied Materials, Inc. Santa Clara, Calif.

The plasma processing apparatus 400 includes a process chamber 402, a platen 434, a source 406, and a modifying element 408. The platen 434 may be positioned in the processing chamber 402 for supporting a substrate 438. The platen 434 may be coupled to an actuator (not shown) which may cause the platen 434 to move in a scanning motion. The scanning motion may be a back and forth movement within a single plane which may be substantially parallel to the modifying element 408. The source 406 is configured to generate the plasma 440 in the process chamber 402. The modifying element 408 includes a pair of insulators 412, 414 which may define a gap therebetween having a horizontal spacing (G). The insulators 412, 414 may comprise an insulating material, a semi-conducting material, or a conductive material. The modifying element also includes a directional element 413 disposed in a position relative to the insulators 412, 414 such that ions 401 are provided toward the substrate 438.

In operation, a gas source 488 may supply an ionizable gas to the process chamber 402. Examples of an ionizable gas may include $BF_3$, $BI_3$, $N_2$, Ar, $PH_3$, $AsH_3$, $B_2H_6$, $H_2$, Xe, Kr, Ne, He, $CH_4$, $CF_4$, $AsF_5$, $PF_3$ and $PF_5$, among others. More specifically, species of ions may include He+, $H_3$+, $H_2$+, H+, Ne+, F+, C+, $CF_x$+, $CH_x$+, $C_xH_y$, N+, B+, $BF_2$+, $B_2H_x$+, Xe+ and molecular carbon, boron, or boron carbide ions. The source 406 may generate the plasma 440 by exciting and ionizing the gas provided to the process chamber 402. The ions 401 are attracted from the plasma 440 across the plasma sheath 442. For example, a bias source 490 is configured to bias the substrate 438 to attract the ions 401 from the plasma 440 across the plasma sheath 442. The bias source 490 may be a DC power supply to provide a DC voltage bias signal or an RF power supply to provide an RF bias signal.

The modifying element 408 modifies the electric field within the plasma sheath 442 to control a shape of the boundary 441 between the plasma 440 and the plasma sheath 442. The modifying element 408 includes the insulators 412, 414 and directional element 413. The insulators 412, 414 and directional element 413 may be fabricated from materials such as quartz, alumina, boron nitride, glass, silicon nitride and other suitable materials. The boundary 441 between the plasma 440 and the plasma sheath 442 is dependent upon the placement of the directional element 413 relative to the insulators 412, 414 as the directional element 413 may alter the electric field within the plasma sheath 442.

Ions following a trajectory path 471 may strike the substrate 438 at about an angle of +θ normal to the plane 451. Ions following trajectory path 469 may strike the substrate 438 at an angle of about −θ normal to the plane 451. Accordingly, the range of incident angles normal to the plane 451 may be between about +1° and about +65° and between about −1° and about −65°, excluding 0°. For example, a first range of incident angles normal to the plane 450 may be between about +5° and about +65° and a second range of incident angles may be between about −5° and about −65°. In one embodiment, the first range of incident angles relative to the plane 451 may be between about −10° and about −20° and the second range of incident angles relative to the plane 451 may be between about +10° and about +20°. In addition, some ion trajectories, such as paths 469 and 471, may cross one another.

Depending on a number of factors including, but not limited to, the positioning of the directional element 413, horizontal spacing (G) between the insulators 412, 414, the vertical spacing (Z) of the insulators 412, 414 above the plane 451, the dielectric constant of the directional element 413 and the insulators 412, 414 and other plasma processing parameters, the range of incident angles (θ), in one embodiment, may be between about +89° and about −89°, exclusive of 0°.

In general, ions provided to a film on the substrate may alter various characteristics of the film. The range of incident angles may be selected based upon an aspect ratio of a 3D feature on the substrate 438 or a localized stress profile of the film. For example, sidewalls 447 of a trench 444, having an exaggerated size for clarity of illustration, may be more uniformly treated by the ions 401 than with conventional plasma processing apparatuses and procedures. The aspect ratio, which may be defined as the relationship between a pitch between the sidewalls 447 and a height of the sidewalls 447 extending from the substrate 438, may determine the angles at which the ions 401 are provided to provide more uniform treatment on the sidewalls 447. For example, a first range of incident angles normal to the plane 451 and adapted to impact the sidewalls 447 may be between about +60° and about +90° and a second range of incident angles may be between about −60° and about −90°. In one embodiment, the first range of incident angles normal to the plane 451 and adapted to impact the sidewalls 447 may be between about −70° and about −80° and the second range of incident angles normal to the plane 451 and adapted to impact the sidewalls 147 may be between about +70° and about +80°. In one embodiment, angles at which the ions 401 are provided may be selected to avoid contact with material below the sidewalls 447, for example, the substrate 438 in one embodiment, or an insulator in another embodiment.

According to certain aspects, the plasma processing apparatus 400 is only one example of an apparatus that may be used. According to certain aspects, traditional plasma processing apparatuses may be used, pattern beams, electron beams (e.g., pulsed or continuous), raster scanning, variable scanning, and any other method of implanting ions or electrons may be used. According to certain aspects, one or more energetic particle beams may include a cylindrical shaped beam, a plurality of adjacent or overlapping cylindrical beams, or a ribbon shaped beam (e.g., a continuous rectangular shaped beam). According to certain aspects, the one or more energetic particle beams can be moved relative to the substrate during processing and/or the substrate can be moved relative to the energetic particle beam during processing. According to certain aspects, different processing characteristics may be used, such as beam energy, beam angle, beam angle relative to the transfer direction of the substrate, beam composition (e.g., gas ions), or other useful property to the surface of the substrate.

The plasma processing system 100 or other system capable of implanting ions or electrons, may be used to modulate stress on a substrate (e.g., such as substrate 438). For example, certain localized areas may be implanted or doped to either increase or reduce localized stress (e.g., based on the type of ion implanted, the energy of the implantation, the location and/or angle of the implantation, etc.) in that area of the substrate. According to certain aspects, the processing may be performed according to a mapping of stress on the substrate. According to certain aspects, the implantation and/or doping process may be performed to achieve more uniformity in stress across the substrate and/or to lower overall (average) stress across the substrate. According to certain aspects, it may be desirable to implant ions of the same or similar chemical makeup as the substrate layer being subject to the doping.

According to certain aspects, although localized stress modulation by implantation is discussed herein as a processing method for correcting overlay errors and EPE, the techniques may be applied to any film in order to modulate local stress.

Figure 5:
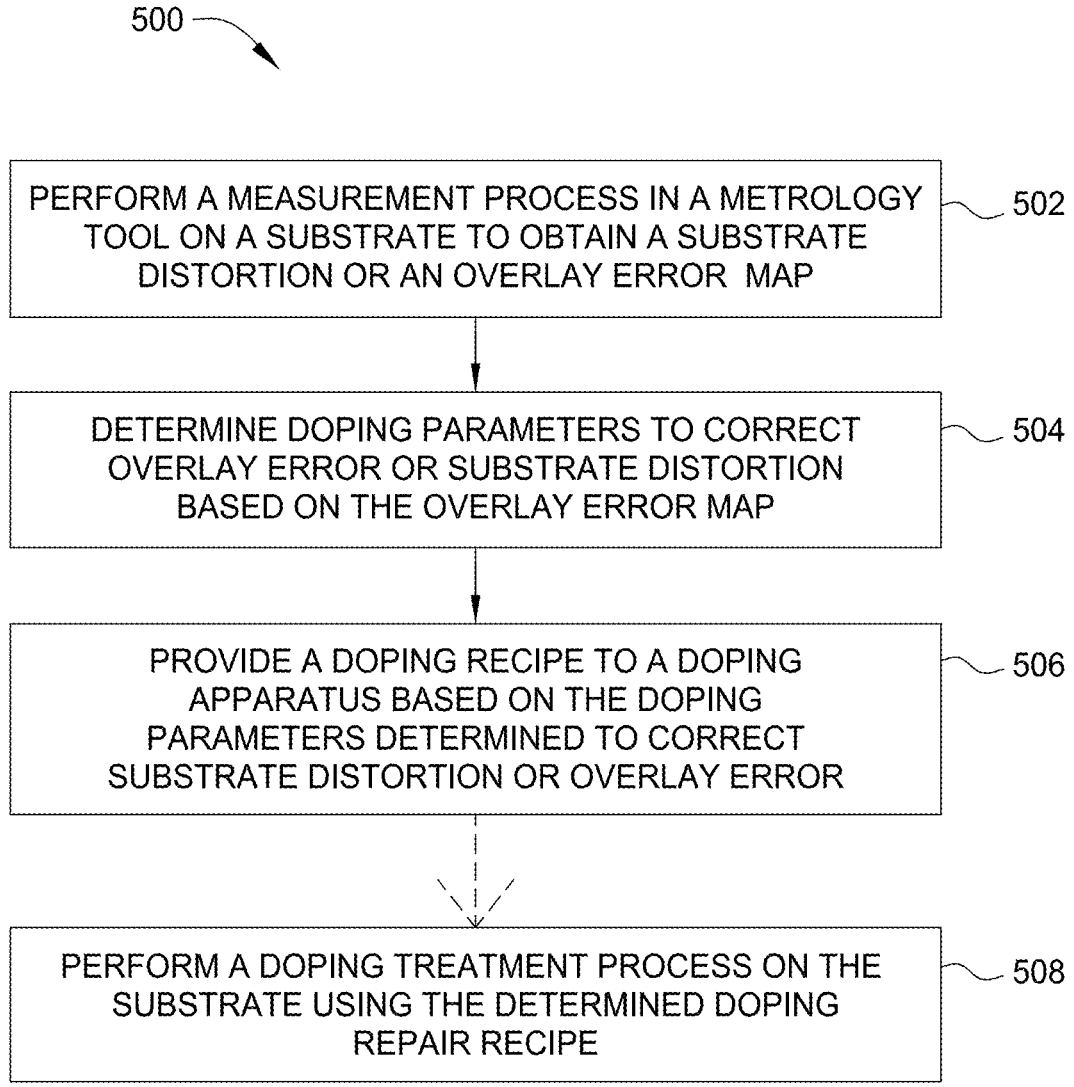
FIG. 5 depicts a flow diagram of a method for performing an overlay correction process on a film layer deposited on a semiconductor substrate utilizing an implantation process, in accordance with certain aspects of the present disclosure.

FIG. 5 depicts a flow diagram of a process 500 for performing an overlay correction process on one or more film layers disposed on a semiconductor substrate by utilizing an implantation process, in accordance with certain aspects of the present disclosure.

The process 500 starts at block 502 by performing a measurement process in a metrology tool (e.g., localized stress vector mapping tool) on a substrate to obtain a substrate distortion or an overlay error map.

At block 504, implantation/doping parameters may be determined to correct overlay error or substrate distortion based on the overlay error map. An implantation/doping recipe may be determined by comparing the overlay error map or substrate distortion with a database library (e.g., including a correlation of stress change in a film layer to the doping parameters) stored in the computing system. In some embodiments, the implantation/doping parameters comprise at least one of energy at which the implantation/doping is performed, whether electrons or ions are used, type of ion used for the doping (e.g., using doping ions of the same type as ions on the substrate layer to be doped), or doping concentration.

At block 506, an implantation/doping recipe may be provided to an implantation/doping apparatus based on the doping parameters determined to correct substrate distortion or overlay error. In some embodiments, determining the doping parameters may include determining discrete locations of the substrate to be treated.

Optionally, at block 508, an implantation/doping treatment process may be performed on the substrate using the determined doping repair recipe. For example, the implantation/doping treatment may be performed using at least one of a plasma beam, electron beam, ribbon beam, or particle beam. The implantation/doping treatment process may include altering a film stress locally or globally in a film layer disposed on the substrate and/or correcting the determined overlay error or substrate distortion found on the substrate. In some embodiments, the doping repair recipe may be determined in response to a film stress, substrate curvature, in plane distortion or pattern shift detected on the substrate. Substrate distortion measured on the substrate may be determined by measuring a film stress of a film layer disposed on the substrate.

According to certain aspects, a photoresist layer may be coated on the substrate and a lithographic exposure process may be performed after the implantation/doping treatment process.

According to certain aspects, the computing system may be incorporated in the metrology tool or in the doping apparatus. The computing system may be in data communication with the metrology tool or the implantation/doping apparatus.

The implantation repair process may alter or modify film properties of the film layer disposed on the substrate exposed to the laser energy treatment alter the film stress/in-plane strain (or pattern shift, or substrate curvature) in the film layer so as to change the shape of the die grid and improve alignment precision for the subsequent lithographic exposure process It is noted that the film layer disposed on the semiconductor layer that may undergo the laser energy repair process may be fabricated from a dielectric material selected from a group consisting of silicon nitride ($Si_3N_4$), silicon nitride hydride ($Si_xN_y$:H), amorphous carbon, silicon carbide, silicon oxide, silicon oxynitride, a composite film of silicon oxide, silicon nitride, silicon carbide or amorphous carbon, an aluminum oxide layer, a tantalum oxide layer, a titanium oxide layer, spin-cast organic polymers, or other suitable material. In another embodiment, film layer may be any suitable polymer organic material, including SOG, polyimide or any suitable materials.

Figure 6:
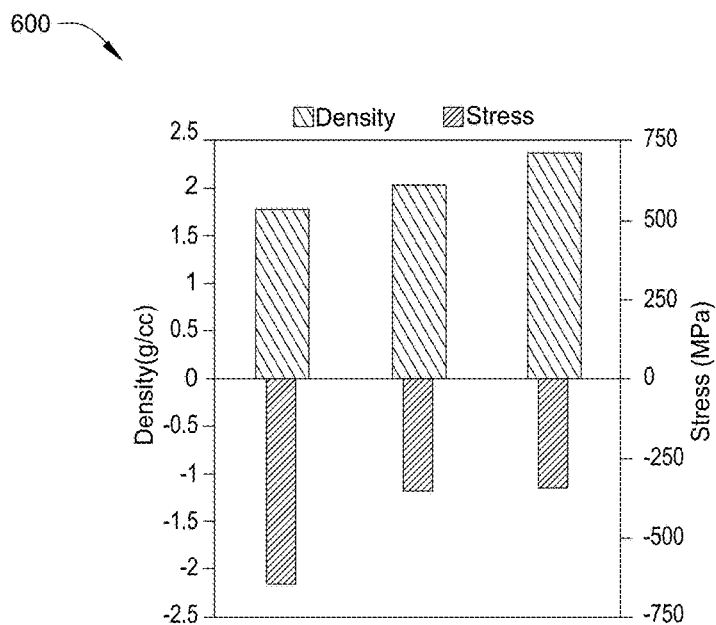
FIG. 6 is a chart illustrating a relationship between density and stress after an overlay correction process is performed on the substrate, in accordance with certain aspects of the present disclosure.

FIG. 6 is a chart illustrating a relationship between density and stress after an overlay correction process is performed on the substrate, in accordance with certain aspects of the present disclosure. As shown in FIG. 6, at high ion doping concentration, density of the location of the film may increase gradually, while stress may be decreased.

Figure 7:
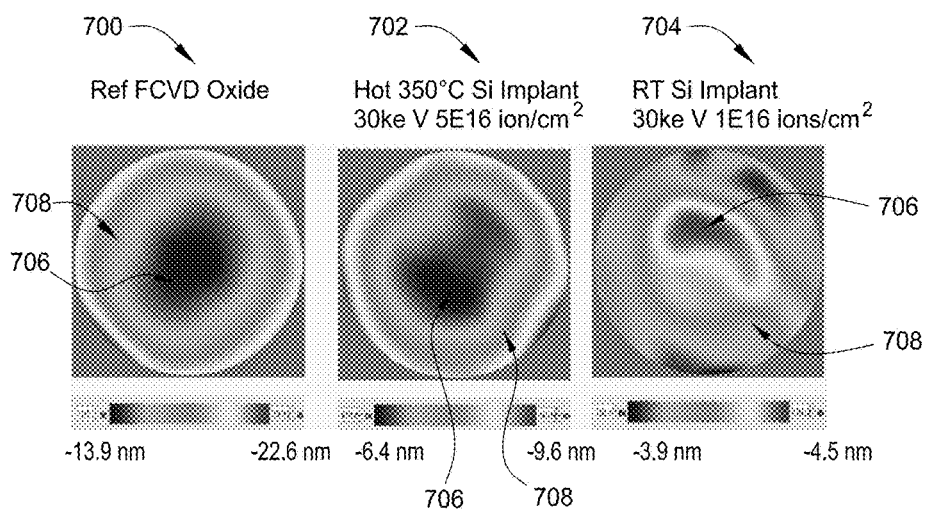
FIG. 7 depicts stress maps illustrating example results after an overlay correction process is performed on the substrate, in accordance with certain aspects of the present disclosure.

FIG. 7 depicts stress maps 700, 702, 704 illustrating results an overlay correction process is performed on the substrate, in accordance with certain aspects of the present disclosure. As shown in FIG. 7, a CVD oxide process may performed to form a layer of film onto a substrate. The stress may be depicted as shown in stress map 700. An inner region 706 may exhibit low stress while an outer region 708 may exhibit higher stress. Stress map 702 may illustrate the stress after a silicon implantation process has been performed. The inner region 706 may exhibit increased stress and the outer region 708 may exhibit reduced stressed. Stress map 704 may illustrate stress after a silicon implantation process at a lower concentration. The inner region 706 may exhibit additional increased stress and the outer region 708 may exhibit additional reduced stress. As shown in stress map 704, the stress may be more uniform than the stress in stress map 700. Additionally, the overall (average) stress may be reduced.

According to certain aspects, the initial stress may be about 200 MPa and the bow may be about 32 nm. The bow may be calculated as the amount of distortion of the substrate from a datum plane. After a hot silicon doping procedure with a dosage of about $1\times10^{16}$ ions/$cm^2$, the stress may be about 33 MPa and the bow may be about 13 nm. After a hot silicon doping procedure with a dosage of about $1\times10^{17}$ ions/$cm^2$, the stress may be about 30 MPa and the bow may be about 13.9 nm. After a room temperature silicon doping procedure with a dosage of about $1\times10^{16}$ ions/$cm^2$, the stress may be about −128 MPa and the bow may be about −3.3 nm. After a hot oxygen doping procedure with a dosage of about $1\times10^{16}$ ions/$cm^2$, the stress may be about −7 MPa and the bow may be about 10.8 nm. Thus, it is apparent that the relationship between implantation and stress may be dependent on type of ion implanted, concentration, and energy of the doping.

In sum, embodiments of the disclosure provide a localized stress modulation by ion or electron implantation (doping) repair processes that may be utilized to correct overlay error and/or EPE after a sequence of lithographic exposure processes. The localized stress modulation repair process as performed may alter film stress/strain distribution in the film layer disposed on the semiconductor substrate. By determining the implantation and/or doping characteristics required to repair and alter film stress/strain in the film layers on the semiconductor substrate, the overlay error and/or EPE may be reduced or eliminated so as to increase alignment precision for the next lithographic exposure process.

While the foregoing is directed to embodiments of the present disclosure, other and further embodiments of the disclosure may be devised without departing from the basic scope thereof, and the scope thereof is determined by the claims that follow.

The invention claimed is:

1. A method for correcting overlay error on a substrate comprising:
   performing a measurement process in a metrology tool on a device film layer deposited on the substrate to obtain a substrate distortion map or an overlay error map;
   identifying an area of the device film layer of the substrate, based on the substrate distortion map or the overlay error map, having a localized stress profile;
   determining doping parameters to correct overlay error or substrate distortion by selecting an ion species configured to increase or decrease the localized stress profile;
   providing a doping recipe to a doping apparatus based on the doping parameters determined to correct substrate distortion or overlay error by modulating a film stress profile of the area having the localized stress profile;
   performing a doping treatment process to implant a same type of ion as present in a device film layer of the substrate using the determined doping repair recipe to increase stress uniformity across the substrate and improve alignment precision for a subsequent lithographic exposure process; and
   coating a photoresist layer on the substrate and performing the lithographic exposure process after the doping treatment process.

2. The method of claim 1, further comprising:
   determining the doping recipe by comparing the overlay error map or substrate distortion map with a database library stored in a computing system.

3. The method of claim 2, wherein the database library includes a correlation of a stress change in the device film layer to the doping parameters.

4. The method of claim 1, wherein the doping parameters comprise at least one of a doping energy selection or a doping concentration selection.

5. The method of claim 1, wherein the doping is performed using at least one of a plasma beam, a ribbon beam, or a particle beam.

6. The method of claim 1, wherein performing the doping treatment process on the substrate further comprises:
   altering the film stress profile locally or globally in the device film layer disposed on the substrate.

7. The method of claim 1, wherein performing the doping treatment process on the substrate further comprises:
   correcting the determined overlay error or substrate distortion.

8. The method of claim 1, wherein the doping repair recipe is determined in response to one or more of film stress, substrate curvature, in plane distortion or pattern shift detected on the substrate.

9. The method of claim 1, wherein the substrate distortion measured on the substrate is determined by measuring a film stress of the device film layer disposed on the substrate.

10. The method of claim 1, wherein a computing system is incorporated in the metrology tool or in the doping apparatus.

11. The method of claim 10, wherein the computing system is in data communication with the metrology tool or the doping apparatus.

12. The method of claim 1, wherein the metrology tool comprises a localized stress vector mapping tool.

13. A method for correcting overlay error on a substrate comprising:
   performing at least one first lithographic deposition or etching process on a device film layer of the substrate;
   determining a substrate distortion map, overlay error map, or edge placement error (EPE) introduced by the at least one lithographic deposition or etching process using a stress vector mapping tool;
   identifying an area of the device film layer of the substrate, based on the substrate distortion map, the overlay error map, or the EPE, having a localized stress profile;
   determining doping parameters to correct overlay error, substrate distortion, or EPE by selecting an ion species configured to increase or decrease the localized stress profile;
   providing a doping recipe to a doping apparatus based on the doping parameters determined to correct substrate distortion, overlay error, or EPE by modulating a film stress profile of the area having the localized stress profile; and
   implanting ions of the same type as present in the device film layer into selected discrete locations of the device film layer to correct substrate distortion, overlay error, or EPE, and increase stress uniformity across the device film layer prior to a second lithography process to reduce overlay errors.

14. The method of claim 13, wherein the implanting is performed using at least one of a plasma beam, a ribbon beam, or a particle beam.

15. A method for correcting overlay error on a substrate comprising:
   measuring a film stress, a substrate curvature, an in-plane distortion, or a pattern shift of a device film layer deposited on the substrate;
   determining an overlay error map or substrate distortion map based on the measured film stress on the device film layer;
   identifying an area of the device film layer of the substrate, based on the overlay error map or the substrate distortion map, having a localized stress profile;
   determining doping parameters to correct overlay error or substrate distortion by selecting an ion species configured to increase or decrease the localized stress profile;
   providing a doping repair recipe based on the doping parameters determined to correct overlay error or substrate distortion by modulating the film stress of the area having the localized stress profile;
   doping the device film layer to implant a same type of ion as present in the device film layer using the determined doping repair recipe to locally change the film stress of the device film layer, to increase stress uniformity across the substrate, and to improve alignment precision for a subsequent lithographic exposure process; and coating a photoresist layer on the substrate and performing the lithographic exposure process after the doping the device film layer.

* * * * *